United States Patent [19]

Theobald

[11] Patent Number: 4,618,739

[45] Date of Patent: Oct. 21, 1986

[54] PLASTIC CHIP CARRIER PACKAGE

[75] Inventor: Paul R. Theobald, Signal Mountain, Tenn.

[73] Assignee: General Electric Company, Schenectady, N.Y.

[21] Appl. No.: 736,019

[22] Filed: May 20, 1985

[51] Int. Cl.$^4$ ............................................. H01L 23/02
[52] U.S. Cl. .................................. 174/52 FP; 29/588
[58] Field of Search ...................... 174/52 FP; 357/74; 29/588

[56] References Cited

U.S. PATENT DOCUMENTS

| | | | |
|---|---|---|---|
| 3,495,023 | 2/1970 | Hessinger et al. | 174/52 FP |
| 4,132,856 | 1/1979 | Hutchison et al. | 174/52 PE |
| 4,396,936 | 8/1983 | McIver et al. | 357/81 |
| 4,396,971 | 8/1983 | Beall et al. | 361/388 |
| 4,437,141 | 3/1984 | Prokop | 361/403 |

Primary Examiner—Arthur T. Grimley
Assistant Examiner—D. A. Tone
Attorney, Agent, or Firm—J. F. McDevitt; Philip L. Schlamp; Fred Jacob

[57] ABSTRACT

A pin grid array package is disclosed for an integrated circuit chip having a preformed main body member of a first synthetic organic polymer with a central cavity in which the integrated circuit chip is mounted, a metallized layer of a second synthetic organic polymer being bonded to said preformed main body member for electrical interconnection to the chip, and with terminal pins protruding from said preformed main body member as a means to further electrically interconnect the chip to exterior electrical terminals. A method to form said main body member is also disclosed using a thermoplastic polymer wherein the terminal pins along with a recessed base element provided in said body member for improved thermal conductivity are included when said main body member is first molded. A further method whereby the integrated circuit chip is assembled in said plastic carrier package is also disclosed.

28 Claims, 4 Drawing Figures

PLASTIC CHIP CARRIER PACKAGE

BACKGROUND OF THE INVENTION

Assorted methods have been employed to mount integrated circuit chips in plastic packages for a lower cost packaging means as compared with ceramic chip packages. While the plastic packages are further recognized to provide several important advantages for the chip operation as compared with ceramic packages, including higher current carrying capacity, lower dielectric constant for shorter operational delay times, along with reduced inductance and capacitance, the generally inferior heat dissipation experienced with plastic packages remains as a problem. This problem is often aggravated by various encapsulation techniques when the chip is mounted in the plastic package whereby additional plastic material is flowed around the mounted chip and rather elaborate heat sink methods are now commonly used in plastic packages as a means to increase heat dissipation. The need for improved heat dissipation is becoming more pronounced with the advent of more sophisticated integrated chips having a higher degree of integration so as to maintain the temperature of the integrated circuit chip within its designed operating limits.

Accordingly, it is an important object of the present invention to provide an integrated circuit device package of principally synthetic organic polymer construction which is both simple to construct as well as utilize while also avoiding any need for complex heat sinking techniques during the packaging process.

Another important object of the invention is to provide a pin grid array carrier package of primarily synthetic organic polymer construction wherein assembly of the chip element and sealing therein by the package user can be readily carried out with automatic equipment.

Still a further important object of the present invention is to provide a means whereby the main body member of said primarily all plastic pin grid array integrated circuit chip carrier package can be formed to incorporate the pin elements together with a heat sink feature when said main body member is initially formed.

Still another important object of the present invention is to provide said pin grid array integrated circuit chip carrier package wherein manufacture of the package construction itself is both simplified and can be carried out with already available automatic manufacturing equipment.

A still further important object of the present invention is to facilitate interconnection of the chip element in various integrated chip carrier packages utilizing any of the commonly employed joinder techniques including wire bonding, solder bump attachment or tape automated bonding.

SUMMARY OF THE INVENTION

Basically, the packaging construction being utilized in accordance with the present invention comprises a planar main body member of a first synthetic organic polymer having a centrally disposed chip connect recess and top and bottom surfaces, the base of said recess being formed with a material having greater thermal conductivity than said first synthetic organic polymer, terminal pins extending from the top surface of said body member and protruding from its bottom surface, and a metallized layer of a second synthetic organic polymer having a central opening larger in crossectional area than the recess provided in the main body member and being bonded to the top surface of said body member to enable electrical connection between the chip and said terminal pins, said electrical interconnection including a metallized trace pattern being deposited on the bottom surface of said metallized layer which interfaces with said top surface of said main body member and with said metallized trace pattern terminating at the outer regions of said metallized layer in terminal pads located in registration with the terminal pin pattern of said main body member while also extending beyond the edges of the central opening in said metallized layer, said metallized layer further including through holes extending between its top and bottom surfaces which are located in registration with the terminal pads provided in the metallized trace pattern. As previously indicated, said main body member can be molded with a thermoplastic material to incorporate the recess base element and terminal pins when initially molded, such as with conventional injection molding equipment. Preforming of the main body member in such fashion not only reduces subsequent manufacturing steps needed for assembly of the entire package but contributes a high degree of structural integrity to the assembled unit. To complete the overall package construction thereafter requires only that the metallized layer be bonded to the main body member in proper registration and with some form of electrical interconnection being provided to permanently secure the terminal pins in the main body member to individual metal traces on the metallized layer.

The through hole openings provided in the metallized layer at the terminal pad locations permits joinder between individual terminal pads and the slightly protuding terminal pin ends to be effected with laser welding an automatic equipment or some other comparable known joinder technique. In one preferred embodiment wherein the inner region of the metallized trace pattern does not extend to the recess cavity of the main body member, the final electrical connection of the chip to the terminal pins can be provided with conventional wire bonding. In other preferred embodiments having the inner regions of said metallized trace pattern extend beyond the polymer medium of said metallized layer and project into the recess cavity of the main body member, still other type known bonding techniques can be used for electrical interconnection between the chip element and terminal pin ends. For example, such cantilever or beam projection of the individual metallized lead ends can be directly bonded to coplaner input/output terminal pads located on the active surface of the chip element by a known tape automated bonding procedure. If the active surface of said chip element includes solder bumps at the input/output terminals, then said electrical interconnection can simply be provided by solder reflow to the projecting beam lead ends of the metal trace in an also known manner.

The assembly procedure employed to bond the metallized layer to the main body member can vary according to the particular materials of construction being utilized in forming the respective parts. For example, the first synthetic organic polymer employed to form the main body member can be a thermoplastic material further having suitable material properties for molding as above indicated along with favorable thermal conductivity such as the Ryton polyimide polymer now available from the Philips Petroleum Company or the Ultem polymer being currently sold by General Electric Company. Further selecting a thermoplastic material for the second synthetic organic polmyer being used to form the substrate of the metallized layer in the form of a flexible tape permits the two parts to be bonded together by various heat-bonding techniques, again on automatic equipment. Alternately, the two parts can be bonded together with a suitable adhesive such as might apply when the first synthetic organic polymer is a different material than the second synthetic organic polymer and one or both of said polymer materials is other than thermoplastic in behavior. The assembled package construction can further include a plastic cover member for protection of the chip element from the atmosphere after being mounted therein as hereinafter described. Said plastic cover member is also bonded to the package construction in various ways again depending upon the respective construction materials being employed and the physical dimensions of the particular package involved. For example, a thermoplastic cover member can be heat bonded directly to the top surface of the metallized layer when said metallized layer occupies the entire surface area of the underlying main body member. Alternately, said thermoplastic cover member can be heat bonded to the top surface of a thermoplastic body member having a smaller planar area metallized layer already bonded thereto.

As above indicated, the metallized layer employed in accordance with the present invention is of a particular configuration having a metallized trace pattern formed on the bottom surface of a polymer substrate and again can be constructed by various conventional techniques on automatic equipment such as screen printing, vacuum metallizing, and even photochemically etching a metal layer pattern into a previously bonded metal layer attached to said substrate with an adhesive. In the aforementioned preferred embodiments, said metallized trace comprises a series of spaced apart copper conductor runs or leads extending inwardly from the terminal pads located at the outer periphery of said layer to project beyond the central opening. The metallized trace pattern can be deposited on the polymer substrate so that registration is obtained between the terminal pad locations in said trace pattern and the through holes previously formed in said polymer substrate. It is thereafter possible to bond said metallized layer to said main body member as previously indicated so that the metal trace pattern is in physical contact with the top surface of said main body member and further registration take place between the terminal pads in said trace pattern and the terminal pin ends slightly protruding from said main body top surface. Permanent joinder between said pin ends and the terminal pads in the also previously indicated manner completes the package construction for direct bonding of the chip element to the heat sink provided in the main body member and final interconnection between input/output terminals of said chip element and the terminal pins of the fully assembled chip package. In a different mode of assembling the final chip package when the metallized trace pattern includes cantilever projection of the inner trace or beam ends beyond the polymer medium of said metallized layer, the chip element can be physically secured to said trace ends prior to bonding said metallized layer to the main body member as above described.

The sequence of manufacturing steps in forming said preferred package construction alone comprises molding a planar main body member of a first thermoplastic synthetic organic polymer having a centrally disposed chip connect recess together with forming the base of said recess with a material having greater thermal conductivity than said first thermoplastic synthetic polymer and further including terminal pins extending from the top surface of said body member and protruding from its bottom surface, all when first molded, further forming a copper metallized trace pattern on the bottom surface of a layer of a second synthetic organic polymer material further including a central opening larger in cross-sectional area than the recess formed in the main body member, said layer further including through holes extending from the top surface to the bottom surface of said organic polymer, therafter forming a pattern of spaced apart copper pads on the bottom surface of said organic polymer so as to be located in registration with the said through holes and the terminal pin locations in the main body member, then bonding together said body member and said metallized layer so that the spaced apart copper pads on the bottom surface of the metallized layer are in physical contact with the ends of the terminal pins located at the top surface of the main body member, and finally permanently joining said terminal pin ends to said spaced apart copper pads.

As above indicated, the mounting of a chip element in the above described package construction to provide electrical interconnection between the input and output terminals of the physically mounted chip and exterior terminals located in an operatively associated electronic device such as a printed circuit board only further requires utilization of known automated joinder techniques, including wire bonding, tape automated bonding, and bumped flip chip soldering. For wire bonding, the chip element is first secured in the package recess by direct physical attachment to the base of said recess cavity with an adhesive or the like and which can also be carried out automatically before the wire bonding interconnection is made. Said wire bonding interconnection also can be carried out automatically whereby individual wire elements extend between a particular input or output terminal located on the top active surface of the physically mounted chip element and the inner end of one conductor run or beam lead on the metallized layer extending into the central opening. As above indicated for other preferred embodiments utilizing tape automated bonding or flip chip soldering of the chip input/output terminals to beam leads which further project into the recess cavity, the chip element is first secured to said beam lead ends and which can be carried out automatically before the chip element is physically bonded in the recess cavity. Subsequent bonding of the chip element in the recess cavity after bonding the metallized layer to the main body member and permanentaly joining the contacting pin ends to the terminal pads of the metallized layer completes this packaging assembly. The polymer cover can now be secured to protect the electrically connected chip from atmospheric deterioration by automatic bonding such as ultrasonic welding, or as previously indicated, by adhesive bonding.

BRIEF DESCRIPTION OF THE PREFERRED EMBODIMENT

Figure 1:
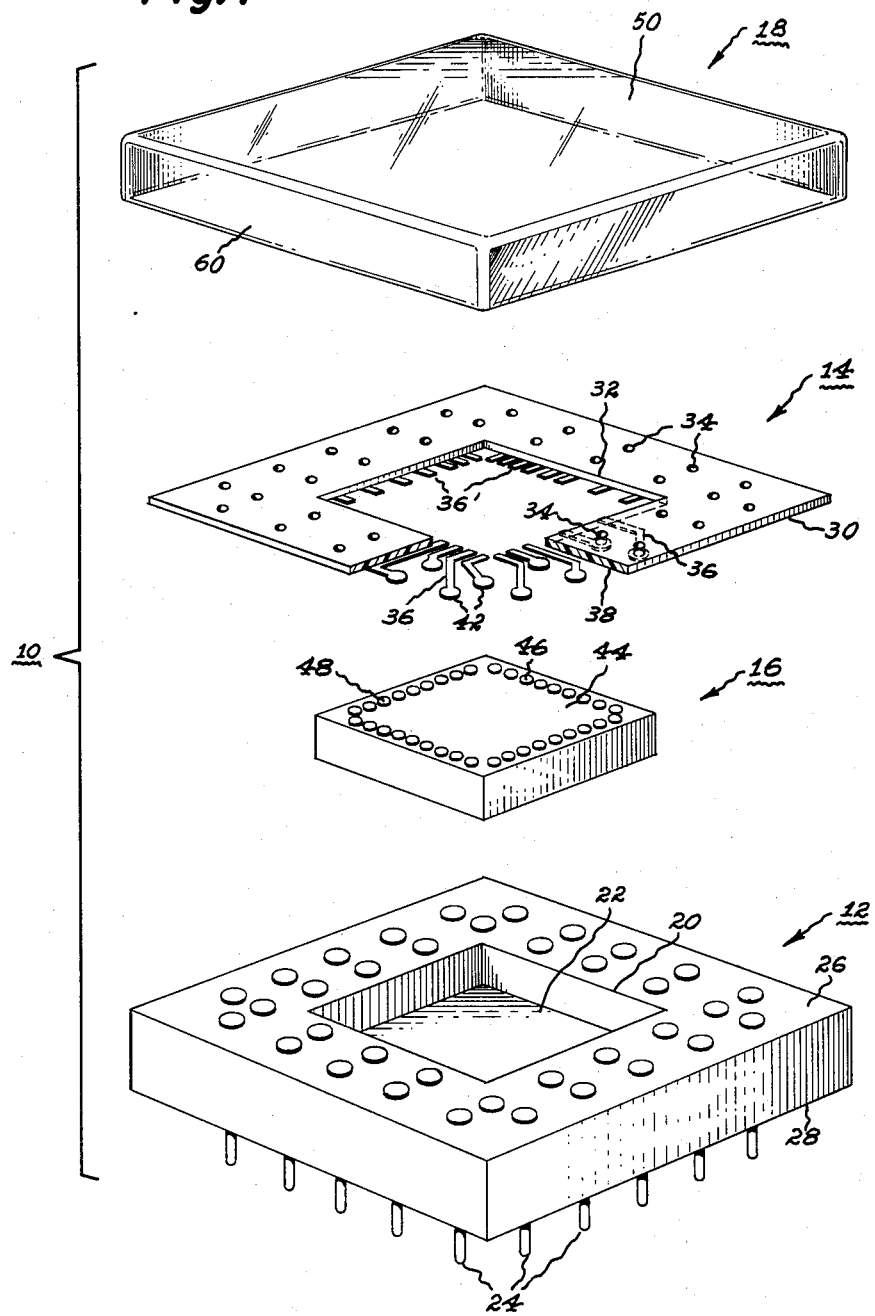
FIG. 1 is an exploded perspective view depicting all principal elements in the pin grid array integrated circuit chip carrier package of the present invention.

In FIG. 1 there is shown the principal elements of a chip carrier package 10 having a plastic main body member 12, a metallized plastic tape 14 for bonding thereto, an integrated chip element 16, and a plastic cover 18 which protects the mounted chip element from atmospheric exposure. Said main body member 12 is formed with a first synthetic organic polymer in a planar shape of generally rectangular or square configuration to have a centrally disposed chip connect recess 20 which further includes a base 22 formed with a material having greater thermal conductivity such as a metal plate, than said first synthetic organic polymer together with metal terminal pins 24, all preferably incorporated therein when said body member is first formed such as by injection molding. As can be noted, the metal terminal pins 24 can be disposed in one or more rows located at the outer periphery of said body member and extend from the top surface 26 of said member to protrude from its bottom surface 28. Base recess element 22 incorporated as an integral part of said main body member when first molded can simply consist of a flat metal or ceramic plate and be further provided with cooling elements such as fins (not shown) to increase heat dissipation from the chip when physically mounted thereon by conventional means such as adhesive bonding with an epoxy adhesive. The metallized plastic tape or layer 14 includes a substrate formed with a second synthetic organic polymer 30 having a central opening 32 of larger cross-sectional area but the same shape as the chip connect recess 20 formed in the main body member along with a series of unmetallized through holes 34 located at the outer peripheral edges of said layer which register with the terminal pin pattern provided in the main body member, and a metallized trace pattern 36 which is deposited on the bottom surface 38 of said layer that interfaces with top surface 26 of the main body member 12. The inner ends 36' (see FIG. 1) of said metallized trace pattern can be seen to extend beyond the edges of central opening 32 while the outer ends of said trace pattern terminate at metallized terminal pads 42 that are in physical registration with the terminal pin ends protruding slightly from the top surface of said main body member 12. The exposed inner ends 36' of said metallized trace pattern remaining after the metallized layer 14 has been bonded directly to said main body member enables electrical connection to be made to the chip element. The through holes 34 which are in registry with the physically contacting terminal pads 42 and terminal pin ends when the metallized layer 14 and main body member have been bonded together thereafter permit automated permanent joinder at said locations as part of said electrical interconnection. Chip element 16 includes a top active surface area 44 having a series of input/output terminals 46 and 48 which can all consist of metallized solder bumps in said surface area for electrical connection to the interior electronic circuit produced therein by conventional means. Plastic cover 18 can again be formed with a selected synthetic organic polymer material in the form of a planar body having a central raised portion 50 and a sealing lip 60 to enclose the packaged chip element from exposure to the atmospheric environment. As mentioned above, the bonding of said plastic cover member to the assembled package construction as well as the bonding together of the plastic components in said package construction can be entirely carried out on automatic equipment using known heat-bonding, ultrasonic welding or adhesive bonding techniques depending upon the particular synthetic organic polymer materials being joined together.

Figure 2:
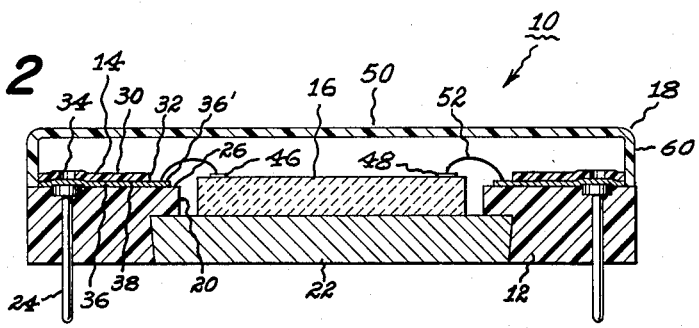
FIG. 2 is a cross-sectional view of the FIG. 1 package assembly after physically mounting and electrically connecting the chip element therein.

In FIG. 2, there is shown a cross-sectional view of the assembled package 10 having the chip element both physically mounted and electrically interconnected in the final assembly. Accordingly, the same numerals are employed as previously used in the FIG. 1 embodiment description to depict the same components in said final assembly and with the only added numeral 52 depicting the wire elements being employed to electrically interconnect the input and output terminals of the mounted chip 16 to individual conductor runs 36 deposited on the metallized layer 14. It can be further noted in said final assembly that all plastic parts have been joined together with the chip element 16 being directly bonded to the recess cavity provided in the main body member. It can be also noted in said final assembly that the upper ends of the metal terminal pins 24 have been joined by welding to the individual spaced apart metallized pads located on the bottom surface of metallized layer 14. The simplified packaging of an intergrated circuit chip in this manner with terminal pin patterns on all four sides of the rectangular chip carrier package as well as multiple pin rows and conductor runs being located on each of the sides provides maximum packaging efficiency.

Figure 3:
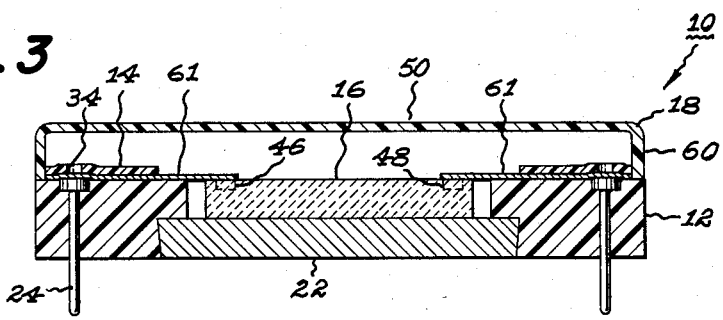
FIG. 3 is a cross-sectional view depicting a different assembled chip carrier package of the invention.

A different integrated circuit package is depicted in cross section in FIG. 3 having the inner ends 61 of the metal trace pattern deposited on the bottom surface of the metallized layer project into the recess cavity of the assembled package construction. Accordingly, the same numerals have again been employed to depict the same components in said final assembly as previously used. It can be noted in the present embodiment, however, that said projecting beam leads ends 61 are now welded or otherwise joined to coplaner input and output terminals 46 and 48 located on the active surface of the chip element 16. As also previously indicated, said chip element can be first secured to the metallized layer 14 by the known tape automated bonding procedure before securing said metallized layer to the main body member also as previously indicated. Subsequent to such assembly of these part together and physically bonding the chip element to base component 22 in said main body member, the same electrical interconection between said chip element and terminal pins previously described for the preceding enbodiment can be carried out to complete the packaged construction.

Figure 4:
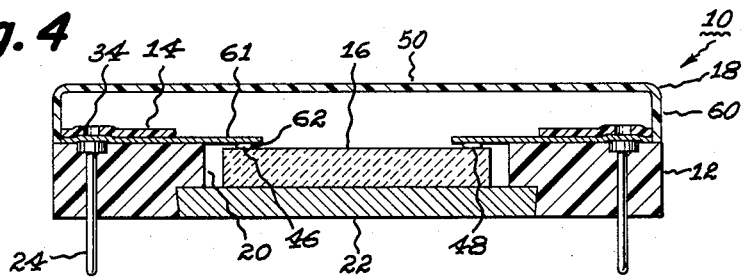
FIG. 4 depicts in cross section still another preferred chip carrier package of the invention after assembly of the chip element therein.

In FIG. 4, there is depicted in cross section still another type integrated circuit package according to the invention. A deeper recess cavity 20 is provided in the main body member 12 to accomodate joining the projecting beam lead ends 61 to solder bumps 62 located at the input and output terminals of the chip element 16. Again, said chip element is preferably attached to the metallized layer 14 before its joinder to the main body member by the known solder reflow procedure and with the remaining assembly for said packaged construction being carried out as above described for the immediately preceding embodiment.

It will be apparent from the foregoing description that a generally useful integrated circuit chip carrier package has been described which is both economical to construct on automatic equipment and provides several advantages over prior art plastic and ceramic package constructions. It will also be apparent that various structural modifications can be made in the particular package embodiments above described without departing from the true scope and spirit of the present invention. For example, a multilayer chip carrier package is also contemplated wherein additional metallized layers are provided to furnish bus connections, ground planes and power planes for high frequency operational requirements of the packaged integrated chip and with electrical interconnection therebetween being carried out with metallized through holes in the respective layers. Additionally, other supplemental heat sink features can be added to the recessed base element described in said embodiments to further improve heat dissipation when the chip element is operated such as by incorporating metal fillers or metal inserts in the polymer material of the main body member for this purpose. It is intended to limit the scope of the present invention, therefore, only by the scope of the following claims:

What I claim as new and desire to secure by United States letters Patent is:

1. A pin grid array integrated circuit chip carrier package comprising a planar main body member of a first synthetic organic polymer having a centrally disposed chip connect recess cavity and top and bottom surfaces, the base of said recess being formed with a material having greater thermal conductivity than said first synthetic organic polymer, terminal pins extending from the top surface of said main body member and protruding from its bottom surface, and a metallized layer of a second synthetic organic polymer being bonded to the top surface of said body member to enable electrical interconnection between the chip and said terminal pins, said electrical interconnection including a metallized trace deposited on the bottom surface of said metallized layer which further includes through holes extending from the top surface of said second polymer to the bottom surface of said metalized layer and terminating in spaced apart metallized pads located on the bottom surface of said metallized layer which are in registration with the terminal pin pattern of the body member.

2. A chip carrier package as in claim 1 wherein the metal trace pattern comprises a series of spaced apart conductor runs extending from the individual terminal pads to said central opening.

3. A chip carrier package as in claim 1 wherein the metal trace pattern further extends into the recess cavity after the metallized layer and main body member have been bonded together.

4. A chip carrier package as in claim 1 wherein the first synthetic organic polymer is a different material than the second synthetic organic polymer.

5. A chip carrier package as in claim 1 wherein the metallized layer is a flexible thermoplastic tape.

6. A chip carrier package as in claim 1 wherein the main body member is a molded thermoplastic material having the recess base element and terminal pins affixed therein when molded.

7. A chip carrier package as in claim 1 wherein both synthetic organic polymer materials are thermoplastic with said materials being heat-bonded together.

8. A chip carrier package as in claim 1 wherein electrical interconnection between the chip and terminal pins further includes wire elements extending from terminal pads located on the chip to the metallized trace deposited on the bottom surface of the metallized layer.

9. A chip carrier package as in claim 1 wherein the terminal pins are welded to metallized pads located on the metallized layer.

10. A chip carrier package as in claim 1 which further includes a cover member bonded to the top surface of the metallized layer.

11. A chip carrier package as in claim 1 which further includes a cover member bonded to the top surface of the main body member.

12. A single layer pin grid array integrated circuit chip carrier package comprising a planar main body member of a first synthetic organic polymer having a centrally disposed chip connect recess cavity and top and bottom surfaces, the base of said recess cavity being formed with a material having greater thermal conductivity than said first synthetic organic polymer, terminal pins extending from the top surface of said body member and protruding from its bottom surface, a chip element having input and output terminal pads located on its top surface and being bonded at its bottom surface to the recess base of said body member, a metallized layer of a second synthetic organic polymer having a central opening larger in crossectional area than the recess provided in the main body member and being bonded to the top surface of said body member to enable electrical interconnection between the chip and said terminal pins, said metallized layer having a metallized trace pattern deposited on the bottom surface of said metallized layer which interfaces with said top surface of said body member and with said metallized trace pattern terminating at the outer regions of said metallized layer in terminal pads located in registration with the terminal pin pattern of said body member while also extending inwardly beyond the central opening in said metallized layer, said metallized layer further including through holes extending between its top and bottom surfaces which are located in registration with the terminal pads provided in the metallized trace pattern, wherein said electrical interconnection between the chip and said terminal pins is effected by wire elements extending from said terminal pads located on the chip to the metallized trace pattern.

13. A chip carrier package as in claim 12 wherein the metal trace pattern comprises a series of spaced apart conductor runs extending from individual terminal pads to said central opening.

14. A chip carrier package as in claim 12 wherein the first synthetic organic polymer is a different material than the second synthetic organic polymer.

15. A chip carrier package as in claim 12 wherein the body member is a molded thermoplastic material having the recess base element and terminal pins affixed therein when molded.

16. A chip carrier package as in claim 12 wherein the terminal pins are welded to the metallized pads located on the bottom surface of the metallized layer.

17. A chip carrier package as in claim 12 which further includes a cover member bonded to the top surface of the metallized layer.

18. A chip carrier package as in claim 12 which further includes a cover member bonded to the top surface of the body member.

19. A method of packaging an integrated circuit chip having input and output terminal pads so as to provide electrical interconnection thereto which comprises:
(a) bonding together a planar main body member of a first synthetic organic polymer having a centrally disposed chip connect recess cavity and top and bottom surfaces, the base of said recess cavity being formed with a material having greater thermal conductivity than said first synthetic organic polymer, and terminal pins extending from the top surface of said body member and protruding from its bottom surface, with a metallized layer of a second synthetic organic polymer, having a central opening larger in cross-sectional area than the recess provided in the main body member, said metallized layer having a metallized trace pattern on the bottom surface, and terminating at the outer regions in terminal pads located in registration with the terminal pin pattern of said body member while also extending inwardly beyond the central opeing in said metallized layer, said metallized layer still further including through holes extending between its top and bottom surfaces which are located in registration with the terminal pads provided in the metallized trace pattern,
(b) bonding the bottom surface of said metallized layer to the top surface of said main body member
(c) bonding the chip to the base recess in said body member,
(d) permanently joining together at the through hole locations the terminal pads on the metal trace pattern to the terminal pin ends located on the top surface of the main body member, and,
(e) electrically connecting the input and output terminal pads on the chip with the inner ends of the metallized trace pattern deposited on the bottom surface of the metallized layer.

20. A method as in claim 19 wherein electrical connection between said terminal pads on the bottom surface of the metallized layer and the ends of the terminal pins extending from the top surface of the body member is effected by welding.

21. A method as in claim 19 wherein the bonding together of the main body member and metallized layer is effected with an adhesive.

22. A method as in claim 19 wherein both synthetic organic polymer materials are thermoplastic with said materials being heat-bonded together.

23. A method as in claim 19 wherein the body member is a molded thermoplastic material having the recess base element and terminal pins affixed therein when molded.

24. A method as in claim 19 wherein the chip is bonded to the base recess with an adhesive.

25. A method as in claim 19 which further includes bonding a cover member to the top surface of the metallized layer.

26. A method as in claim 19 which further includes bonding a cover member to the top surface of the body member.

27. A method of forming an integrated circuit chip carrier package which comprises:
(a) molding a planar main body member of a first thermoplastic synthetic organic polymer having a centrally disposed chip connect recess cavity together with forming the base of said recess with a material having greater thermal conductivity than said first thermoplastic synthetic organic polymer and further including terminal pins extending from the top surface of said body member and protruding from its bottom surface, all when first molded,
(b) depositing a copper metallized trace pattern on the bottom surface of a layer of a second synthetic organic polymer material further including a central opening larger in cros-sectional area than to the recess formed in the main body member, said layer further including through holes extending from the top surface to the bottom surface of said layer,
(c) further forming a pattern of spaced apart copper runs in said metal trace pattern commencing with terminal pads located at the through hole locations and extending inwardly into the recess cavity of the main body member
(d) bonding together said body member and said metallized layer so that the spaced apart copper pads on the bottom surface of the metallized layer are in physical contact with the ends of the terminal pins extending from the top surface of the body member, and
(e) permanently joining said terminal pin ends at the through hole locations to said spaced apart copper pads.

28. A method as in claim 27 wherein said terminal pin ends are permanently joined to said spaced apart copper pads by welding.

* * * * *